United States Patent [19]

Bartoli et al.

[11] 4,012,691

[45] Mar. 15, 1977

[54] DETERMINATION OF THERMAL IMPEDANCES OF BONDING LAYERS IN INFRARED PHOTOCONDUCTORS

[75] Inventors: Filbert J. Bartoli, Upper Marlboro, Md.; Leon Esterowitz, Springfield; Roger E. Allen, Alexandria, both of Va.; Melvin R. Kruer, Oxon Hill, Md.

[73] Assignee: The United States of America as represented by the Secretary of the Navy, Washington, D.C.

[22] Filed: Apr. 8, 1976

[21] Appl. No.: 674,999

[52] U.S. Cl. .......................... 324/65 R; 324/71 SN
[51] Int. Cl.² ...................................... G01R 27/02
[58] Field of Search ..................... 324/65 R, 71 SN

[56] References Cited

UNITED STATES PATENTS

| 3,731,187 | 5/1973 | Hausler et al. | 324/65 R |
| 3,781,911 | 12/1973 | Davidson | 324/65 R |
| 3,936,738 | 2/1976 | Maltby | 324/65 R X |

Primary Examiner—Stanley T. Krawczewicz
Attorney, Agent, or Firm—R. S. Sciascia; Philip Schneider; Melvin L. Crane

[57] ABSTRACT

A method of determining thermal constants of bonding layers of an infrared sensor which comprises cooling a bonded layer sensor to 77°K and then heating the sensor by a quick pulse of heat. The electrical resistance of the sensor is measured and the measurement continued to determine a thermal profile. The measured thermal profile is compared with a known profile to determine thickness of the bonding layers and the material layers.

4 Claims, 2 Drawing Figures

DETERMINATION OF THERMAL IMPEDANCES OF BONDING LAYERS IN INFRARED PHOTOCONDUCTORS

BACKGROUND OF THE INVENTION

This invention relates to a method of determining the thermal conductances and impedances of thermally resistive bonding layers used in infrared photoconductors.

In use of an epoxy to bond HgCdTe crystal detectors onto an Irtran 2 or sapphire substrate which is mounted onto a heat sink by a varnish, it has been determined that the epoxy and varnish bonding layers are thermally resistant and restrict heat flow from the detector to the heat sink. Further, the thermal conductances of these layers vary considerably from detector to detector.

It has been determined that the characteristics of thermal recovery processes are found to be quite sensitive to the specific details of the detector construction. Thermal recovery takes place in two separate time periods. Initially the signal recovers partially to an intermediate level on a time scale of several milliseconds. The rest of the recovery occurs much more slowly, on the order of hundreds of milliseconds. It has been determined that the magnitude of the thermally induced signal, the relative importance of the two recovery processes and the exact shape of the thermal recovery curve vary with power density and irradiation time.

Heretofore techniques for measuring the thermal characteristics of detectors have been restricted to DC bias current effects. This technique measures the thermal conductance of the total assembly without any capability of obtaining the thermal conductance of each layer. Also, the method only provides information on the steady state power handling capability of the detector without any information on pulse response.

SUMMARY OF THE INVENTION

It has been determined that the thermal recovery processes in laser irradiated infrared photodetectors are specific to the details of their construction. For the most part, thermal recovery takes place on two separate time scales due to the construction. Initially the signal recovers partially to an intermediate level on a time scale of several milliseconds. The rest of the recovery occurs much more slowly, that is, on the order of hundreds of milliseconds. It has been determined that the magnitude of the thermally induced signal, the relative recovery periods and the exact shape of the thermal recovery curve vary with power density and irradiation time. The two recovery times have been determined to be due to the two thermally resistive layers. This process may be used to determine the uniformity of the two resistive layers of already assembled detectors.

DETAILED DESCRIPTION

Figure 1:
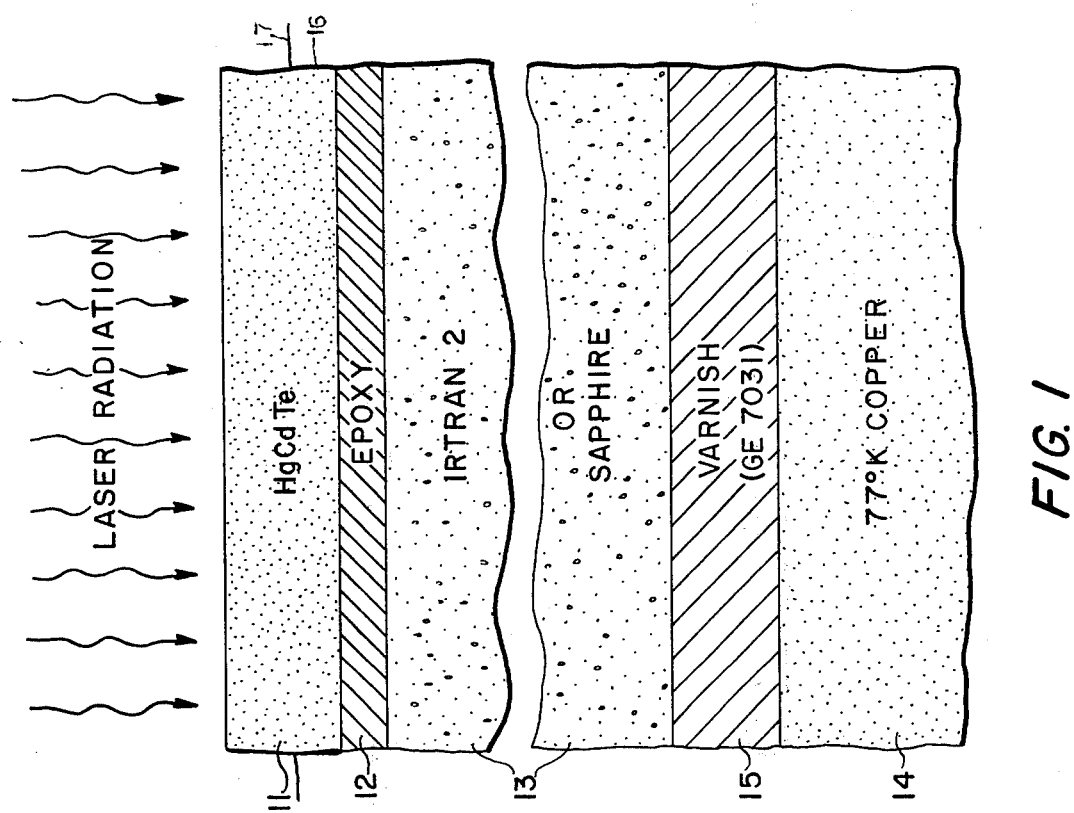
FIG. 1 illustrates a cross sectional view of an infrared photodetector.

The drawing illustrates an infrared photodetector of the type in which thermal conductances are to be determined. As shown, the infrared photoconductor includes a HgCdTe crystal 11 bonded by a layer of an epoxy 12 to an Irtron 2 or sapphire substrate 13 which is mounted onto a copper heat sink 14 by a layer of Ge 7031 varnish 15. The copper heat sink is maintained at the detector operating temperature (77° K for HgCdTe photoconductors), in order that the thermal conductances of the bonding layers be determined at the temperature at which the detector operates. The HgCdTe crystal detector is provided with electrodes 16 on the ends to which conductors 17 are fused. The conductors are electrically connected with an amplifier which amplifies an output signal derived in the crystal 11 due to the temperature of the crystal. The amplifier is electrically connected with a Tektronix Digital processing oscilloscope system for measuring and storing the output signal. Any other suitable detector may be used. Due to heating of the crystal and the heat insulating qualities of the epoxy and the varnish, the crystal does not return to its original temperature immediately. Therefore these qualities may be used in a method for determining the thermal conductances and impedances of the bonding layers used in construction of infrared photoconductors.

The method of this invention is carried out by irradiating an infrared photoconductive detector as described above with laser radiation having a known output for a specific period of from about 200$\mu$m to 200 msec. The detector is heated by the laser pulse and the thermally induced change in detector resistance is measured immediately following the pulse. Due to heating, the detector does not return immediately to its original value but recovers only after a time associated with the time required for the detector to return to its original preirradiated temperature. The detector output will result in a temperature time curve characteristic of thermally-induced change in the detector resistance. Since the detector crystal is mounted onto a substrate by an epoxy layer and the substrate is mounted onto a heat sink by a varnish layer the curve will be affected by the epoxy layer, the substrate, and the varnish layer. For less expensive operation and in the event one does not have a laser available, the detector crystal may be heated by an electrical pulse through the leads connected to the crystal.

During incidence of the radiation pulse, the detector assembly is heated simultaneous with being cooled by the heat sink. Heating is greater than cooling. Therefore a particular resistance curve will be indicated by the oscilloscope or other output measuring device immediately after incidence of the radiation due to the increase of heat. Since the incident laser pulse is short, the photoconductive crystal will heat first and to a higher temperature than the other layers. Since the epoxy is a barrier to heat travel toward the heat sink and cooling of the detector due to the heat sink, the curve will show a decrease in temperature of the detector because heat is passing toward the heat sink. Once the heat from the detector crystal has overcome the heat resistance of the epoxy, the substrate heat flows through the epoxy layer to the substrate raising to a slightly higher temperature, and the detector will be at a lower temperature than that to which it was originally heated. The substrate is heated to its maximum temperature by transfer of heat from the crystal layer which presents another barrier. The temperature of the varnish layer is then increased slightly. Simultaneous with heating of the substrate and varnish, the detector is losing heat and the heat measuring device will indicate the loss of heat due to a change in resistance in the detector. The resistance of the detector decreases as heat is lost until the detector returns to its original temperature.

Figure 2:
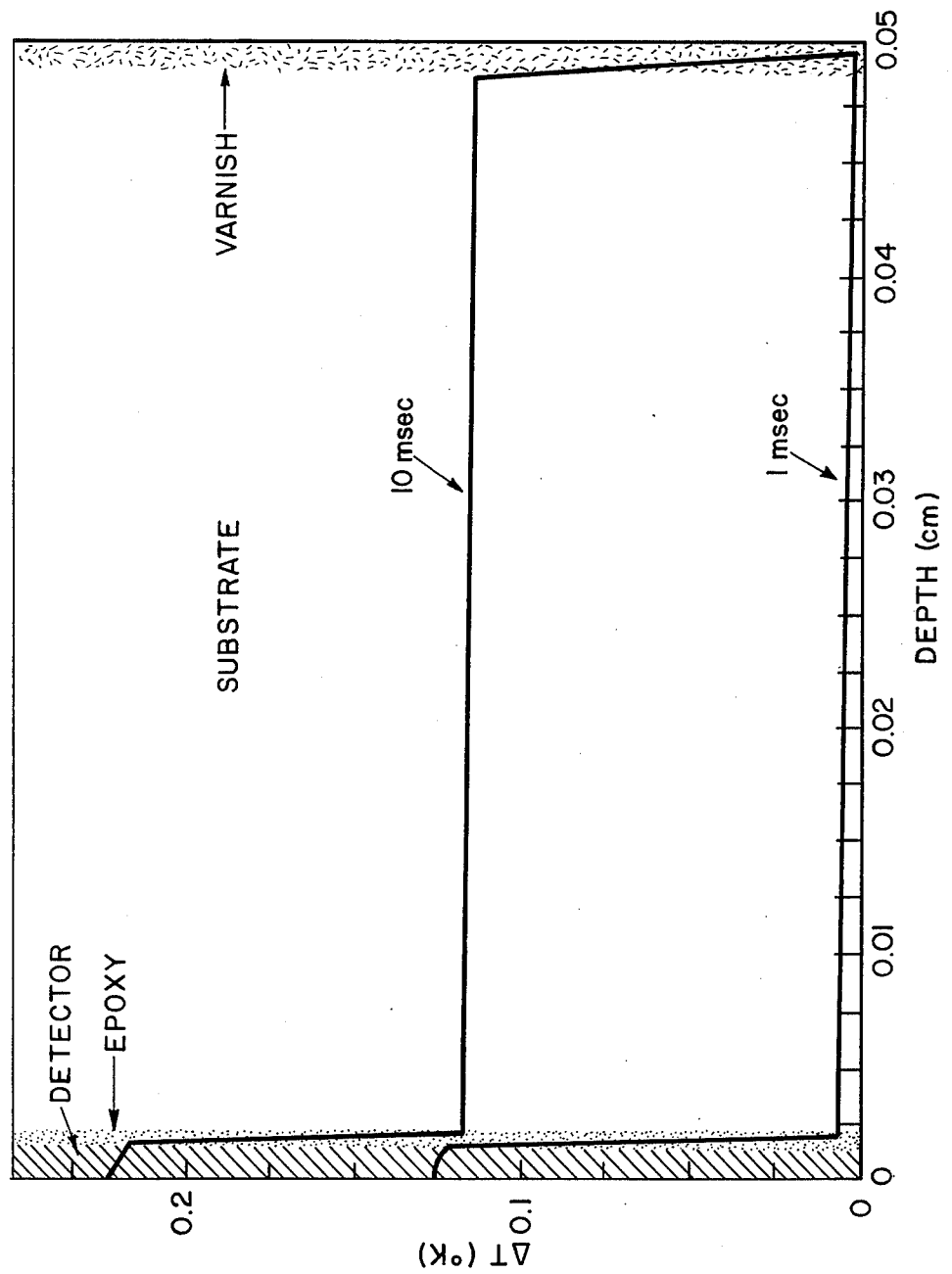
FIG. 2 illustrates thermal profiles for a HgCdTe detector with a substrate at the end of 1 msec and 10 msec pulses with a laser power density = 1 w/cm$^2$.

FIG. 2 illustrates thermal profiles of the detector immediately following incident laser pulses of 1 msec. and 10 msec. As seen by the thermal profiles for the 1 msec irradiation beam, the temperature of the detector is approximately constant and there is a large thermal gradient across the epoxy and very little heat has reached the substrate. The detector becomes hotter with a 10 msec pulse, therefore, appreciable heat reaches the substrate and some enters the varnish. As can be seen by the thermal profile, the thermal gradients in the epoxy and varnish are much greater than those in the detector and substrate.

By using the present method of pulse heating the detector and measuring the thermal profile immediately, many parameters may be determined by matching the thermal profile obtained with a known thermal profile curve. For a known pulse time, the power density may be measured. For a known pulse density and time of exposure the thermal conductance of the epoxy layer and the varnish layer may be determined.

Thus, the method may be used on an assembly line of infrared photoconductive detectors to determine the thermal characteristics of the detectors after thay have been assembled.

The method herein has been included in a publication "Thermal Recovery Processes in Laser Irradiated HgCd Te (PC) Detector", by F. J. Bartoli et al.; *Applied Optics*, Vol. 14, No. 10, pp 2499–2507, October 1975, and is incorporated herein as part of this disclosure.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of determining thermal constants of bonding layers of an infrared sensor that includes different layers of material which comprises:
    securing said sensor onto a heat sink;
    heating said sensor by a laser output source for a set time period;
    subsequent to heating said sensor immediately measuring and recording the electrical resistance of said sensor;
    continue measuring and recording the electrical resistance for a set period of time to establish a thermal profile of each layer of said sensor; and
    comparing said thermal profile with thermal profiles of known parameters of incident laser output, thickness of bonding layers, and same types of layer materials.
2. A method as claimed in claim 1, in which;
    said sensor is secured onto said heat sink by bonding with a varnish.
3. A method as claimed in claim 1 wherein:
    said sensor is heated by a laser output.
4. A method as claimed in claim 1 wherein:
    said sensor is heated by an electrical pulse.

* * * * *